United States Patent [19]

Thatte

[11] Patent Number: 4,594,711
[45] Date of Patent: Jun. 10, 1986

[54] UNIVERSAL TESTING CIRCUIT AND METHOD

[75] Inventor: Satish M. Thatte, Richardson, Tex.

[73] Assignee: Texas Instruments Incorporated, Dallas, Tex.

[21] Appl. No.: 551,667

[22] Filed: Nov. 10, 1983

[51] Int. Cl.4 .......................................... G01R 31/28
[52] U.S. Cl. .................................. 371/25; 324/73 R
[58] Field of Search .................. 371/25, 15; 324/73 R

[56] References Cited

U.S. PATENT DOCUMENTS

| 4,320,509 | 3/1982 | Davidson | 371/25 |
| 4,498,172 | 2/1985 | Bhavsar | 371/25 |
| 4,503,536 | 3/1985 | Panzar | 371/25 |
| 4,503,537 | 3/1985 | McAnney | 371/25 |

OTHER PUBLICATIONS

Konemann et al., Built–In Test for Complex Digital Integrated Circuits, Fifth European Solid State Circuits Conf., ESSCIRC 79, Sep. 18–21, 1979, Southampton, England, pp. 89–90.

Fasang, Circuit Module Implements Practical Self-Testing, Electronics, vol. 88, No. 1557, May 19, 1982, pp. 164–167.

Hahn et al., VLSI Testing by On–Chip Error Detection, IBM Tech. Disclosure Bulletin, vol. 25, No. 2, Jul. 1982, p. 709.

Carter, Improved Signature Test for VLSI Circuits, IBM Tech. Disclosure Bulletin, vol. 26, No. 3A, Aug. 1983, pp. 965–967.

Primary Examiner—Charles E. Atkinson
Attorney, Agent, or Firm—Kenneth C. Hill; Robert O. Groover; James T. Comfort

[57] ABSTRACT

A test circuit, called a universal testing block (UTB) for on-chip testing of a VLSI subsystem such as a ROM or an ALU has several modes, including test generator and test evaluator, formed on the VLSI chip. The test generator circuit includes means for applying a predetermined test pattern to an input channel of the subsystem and may be a generator for generating pseudorandom test patterns for application to the subsystem. Alternatively, the test generator may be a counter which can be selectively activated to generate a binary up-count. The UTB also has a shift register mode having a serial input and output to enable serial data to be shifted into and out of the subsystem in parallel fashion. The test evaluator circuit receives output signals from the subsystem, and includes a parallel signature analyzer to generate a signature of the subsystem after the application of the test patterns by the input circuit to indicate whether the subsystem is fault-free. Also, means are provided for evaluating the signature and for generating a signal in accordance with the evaluation indicative of whether the subsystem is fault-free.

8 Claims, 6 Drawing Figures

UNIVERSAL TESTING CIRCUIT AND METHOD

The U.S. Government has a paid-up license in this invention and the right in limited circumstances to require the patent owner to license others on reasonable terms as provided for by the terms of Contract No. F30702-81-C-0032 awarded by the U.S. Air Force.

This application is related to the following co-pending applications having common ownership: METHOD AND APPARATUS FOR CONCURRENT CHECKING OF PROGRAM FLOW VLSI PROCESSORS, Ser. No. 551,658, filed Nov. 14, 1983 by Thatte; and ARCHITECTURE AND METHOD FOR TESTING VLSI PROCESSORS, Ser. No. 551,648, filed Nov. 14, 1983 by Thatte, et al.

BACKGROUND OF THE INVENTION

1. Field of the Invention

This invention relates to improvements in large and very large scale integrated (LSI and VLSI) circuits, and more particularly to improvements in methods and apparatuses for testing such circuits.

2. Description of the Prior Art

With advancing developments of very large scale integrated (VLSI) semiconductor circuits, the number of circuit elements, such as gates, flip-flops, and memory cells, on an integrated chip is expanding to very large numbers. This expansion has given rise to increasing problems in testing the chips, both in their original manufacturing test and during their use in the field. Some of the problems encountered in VLSI testing are as follows.

The complexity and cost of test generation and fault simulation increases with an increasing number of circuit elements. It has been reported, in fact, that the test generation and fault simulation cost for a chip grows approximately proportionally to the third power of the number of gates and flip-flops on the chip. This problem has been recognized, for example in "Testing logic networks and designing for testability", by T. W. Williams et al., Computer, Vol. 12, No. 10, October 1979, pp. 1–21.

Similarly, the length and execution time of tests increase with the increasing complexity of chips. Since the chip manufacturing cost is expected to decrease over time as production volume increases, the testing cost is expected to become a significant portion of the overall chip cost.

Fault coverage provided by existing test methods is not adequate since most of the tests used presently are designed to detect only the so-called single "stuck-at" faults. Very small circuit features, low voltage levels, and very large number of devices present on a VLSI chip are expected to give rise to many failure modes which cannot be modeled or detected as single "stuck-at" faults.

Presently, conventional testers analyze the serial bit streams produces at a particular point within the circuit under test. A probe is provided to physically contact a test pad or pin, and the logic signals at the point are examined. As the size of VLSI circuits is reduced further and further, it is becoming increasingly difficult to access many internal points on a VLSI chip using a conventional tester via a limited number of input/output pads or pins.

Conventional test methods when applied to VLSI circuits are also faced with enormous test data volume. For example, in a VLSI processor housed in a 64 pin package, if each machine instruction requires an average of 5 machine cycles, the test data volume for 10,000 machine instructions in a test program translates into over 3 million bits.

In the past, various testing techniques have been developed. For example, IBM has developed a technique referred to as "level sensitive scan design", in which a complex sequential circuit is transformed during a test mode into simple combinational logic and one (or more) serial shift, or scan, registers. A desired test pattern is serially shifted into this scan register from an external pin (i.e. from an external test pattern source), and once the test pattern is stored in the scan register, it is applied to the combinational logic under test. The test result produced by the combinational logic alters the contents of the scan register. The test result stored in the scan register can be serially shifted out to an external pin, for comparison with an expected test result outside the chip. It can therefore be seen that the scan register provides a convenient and easy means to apply test patterns, and to read out the test results produced by the combinational logic, which may be "buried" deep inside the chip. One of the disadvantages of this type of testing approach is that it is operated at a relatively slow speed since the test patterns and results are shifted into and out of the scan register in a bit-serial fashion. Thus, the testing is not accomplished at full operational speed, and errors which result, for example, because of timing inaccuracies or flaws may not be disclosed by the test.

Another well known test technique is called "serial signature analysis", and is incorporated in an instrument manufactured by Hewlett Packard Company. Serial signature analysis is a data compression technique used to compress test result data produced in the form of a serial bit stream. It is based on the principle of cyclic redundancy check, which is implemented by means of a linear feedback shift register. For example, in a 16 bit serial signature analyzer, the outputs of the 7th, 9th, 12th, and 16th flip-flops in the linear feedback shift register are fed back to the 1st flip-flop through an exclusive-or gate. The input of the 1st flip-flop is an exclusive-or combination of the feedback signal, and the serial data input. The exclusive-or gates perform a modulo 2 sum operation, a linear operation, on its inputs. Therefore the feedback register of this type is referred to as a linear feedback shift register, and essentially performs a polynomial division on the serial input data stream.

In products embodying this technique, the serial bit stream of test result is compressed by a serial signature analyzer and presented in the form of four hexadecimal digits known as the signature of the node producing that particular serial bit stream test result. The signature produced by a node is usually visually compared with the expected signature.

Reference is made to B. Konemann et al., "Built-in Logic Block Observation Techniques", Digest of papers, 1979 Test Conference, 79CH1509-9C, October 1979, pp. 37–41 which discloses the extension of serial signature analysis techniques to the compression of a parallel bit stream. The circuit ordinarily used is similar to that used for compressing serial bit streams, but the input of each flip-flop comes from an exclusive-or combination of the output of the previous flip-flop with each member of the parallel bit stream providing an input to each respective flip-flop. This type of signature analysis is referred to as parallel signature analysis, and results in considerable savings in time from that required by serial signature analysis techniques.

Other papers in this area to which reference is made are as follows. "Signature Analysis", Hewlett-Packard Journal, Vol. 28, No. 9, May, 1977; "Shift-register sequences", by S. W. Golomb, Holden-Day, Inc., San Francisco, 1967; and "Signature analysis: A new digital field service method" by R. A. Frohwerk, Hewlett Packard Journal, Vol. 28, No. 9, May, 1977.

SUMMARY OF THE INVENTION

In light of the above, therefore, it is an object of the invention to present a VLSI design which overcomes or reduces the foregoing testing complexities and problems.

It is another object of the invention to present a VLSI design of the type described in which the testing hardware and function are an integral part of the VLSI chip itself.

It is another object of the invention to present a VLSI design of the type described which is resident on a VLSI chip, and which uses a maximum amount of hardware provided on the VLSI chip as a part of its original design, that is, which requires a minimum amount of additional hardware to implement test functions.

It is another object of the invention to present a VLSI design of the type described which provides for comprehensive device testing without a requirement for external testing equipment.

It is another object of the invention to present a VLSI device of the type described which performs testing operations at the normal full speed of the VLSI device.

It is another object of the invention to present a VLSI device of the type described in which the testing criterion can be individually created for the particular requirements of the VLSI device from the beginning of the VLSI design cycle.

It is another object of the invention to present a VLSI device which includes an on-board testing capability economically and flexibly.

It is another object of the invention to present a VLSI device of the type described which provides customizability by selective modes, widths, etc.

These and other objects, features and advantages will become apparent to those skilled in the art from the following detailed description when read in conjunction with the accompanying drawing and appended claims.

In its broad aspect, the invention presents a test circuit referred to herein as a "universal testing block", or "UTB", for on-chip testing of a subsystem of a VLSI chip. As will become apparent, the UTB can be used to test any circuit or subsystem of the VLSI chip, a typical subsystem being, for example, a read only memory (ROM) or an arithmetic and logic unit (ALU) on the VLSI chip. The UTB includes both test generator and test evaluator modes formed on the VLSI chip. The test generator includes means for applying a predetermined test pattern or a sequence of test patterns to an input channel of the subsystem, and it may be a pseudorandom pattern generator for generating pseudorandom test patterns for application to the subsystem. Alternatively the test generator may be a counter which can be selectively activated to generate a binary up count. The UTB also has a shift register mode having a serial input and output to enable serial data to be shifted into and out of the subsystem. The UTB includes a test evaluator mode also realized on the VLSI chip for receiving and evaluating test results produced by the subsystem, and includes a parallel signature analyzer to generate a signature of the subsystem after the application of a sequence of test patterns by the test generator circuit to indicate whether the subsystem is fault-free. Also, means are provided for evaluating the output signals from the subsystem, and for generating a signal in accordance with the evaluation indicative of whether the subsystem is fault-free.

BRIEF DESCRIPTION OF THE DRAWINGS

The invention is shown in the accompanying drawings, in which.

In the various views of the drawing, the same reference numerals are used to denote like or similar parts.

DETAILED DESCRIPTION OF THE PREFERRED EMBODIMENTS

As will become apparent, the invention presents a novel technique to implement test pattern generation and evaluation by means of a circuit incorporated directly onto a VLSI chip. The circuit is referred to herein as a universal testing block, or UTB. As will become apparent, the testing technique associated with the circuit performs on-chip testing economically and flexibly, and can be easily incorporated into the design process from the beginning of the design cycle of the chip, and therefore, can be particularly powerful in its ability to test the particular circuit under consideration.

Figure 1:
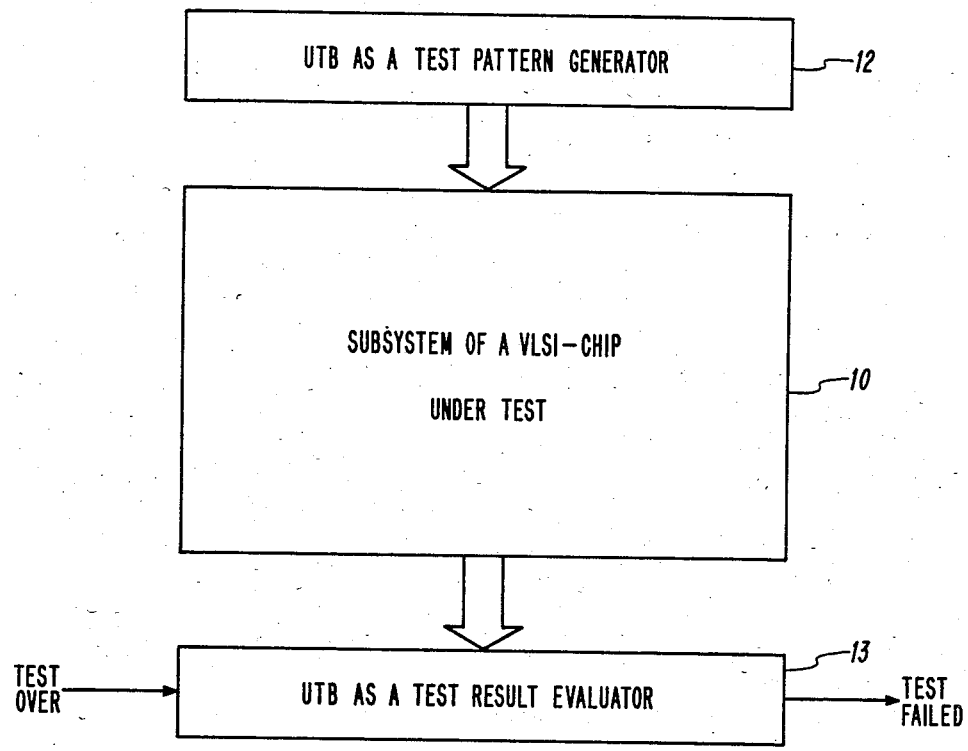
FIG. 1 is a subsystem block schematic diagram illustrating the generalized use of the circuit and method of the invention on a VLSI chip.

With reference now to FIG. 1, the inputs and outputs (or some subset thereof) of a subsystem 10, such as a ROM or an ALU, to be tested on a VLSI chip is connected to a respective on-board UTB (circuits 12 and 13), in accordance with the invention. The input circuit 12, connected to the inputs of the subsystem, is configured to generate test patterns for application to the subsystem, and the output circuit 13, connected to the outputs of the subsystem, is configured to monitor the subsystem output and evaluate the test results. After all the test patterns in the test set have been applied, the output circuit produces an output signal which indicates whether the subsystem passed or failed the test. This pass/fail signal can be brought out on an external pin of the chip or used in any desired manner. As will become apparent, the UTB can work as an on-chip test generator or an on-chip test evaluator, or both.

Figure 2:
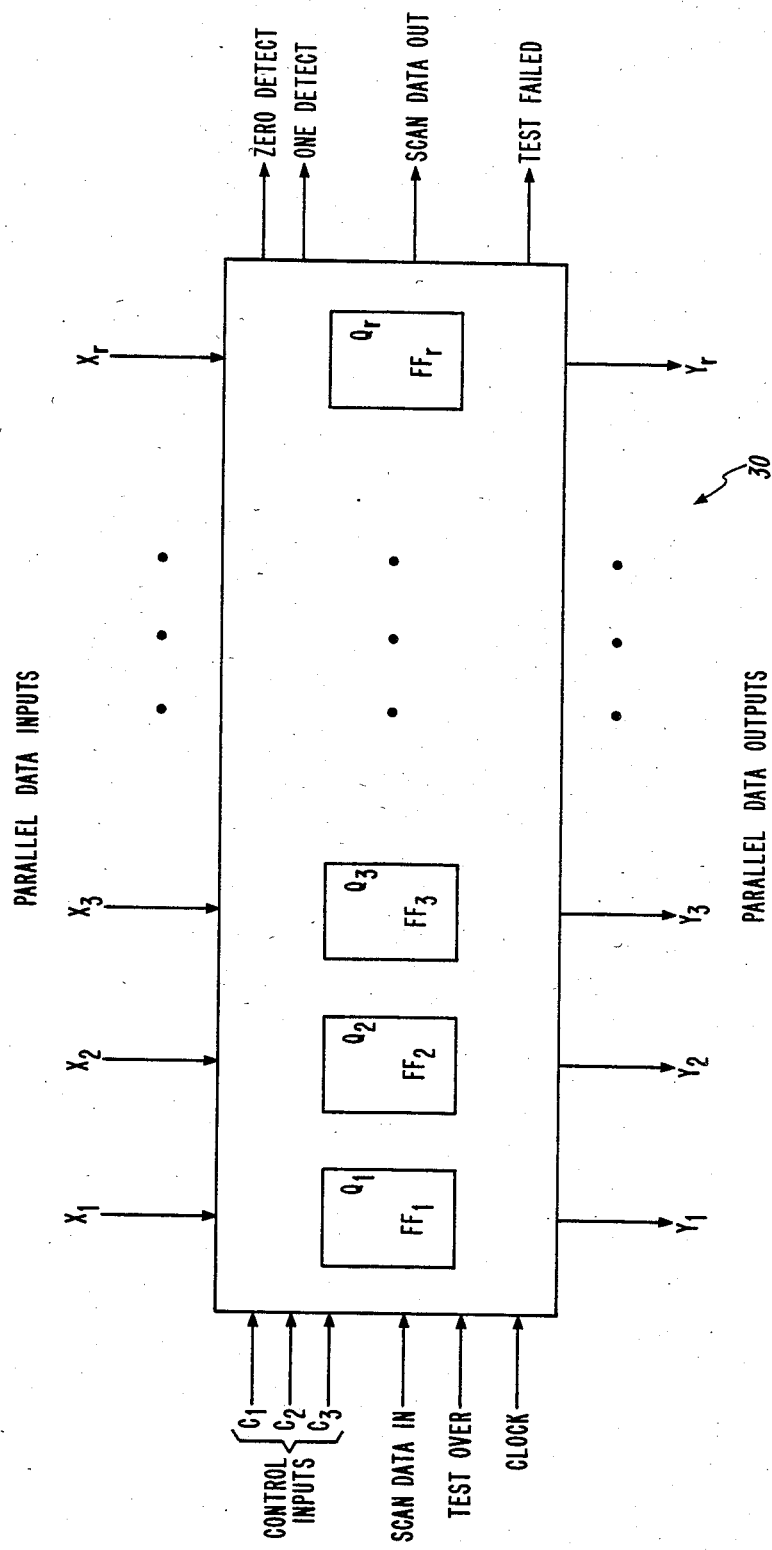
FIG. 2 is a schematic diagram of a preferred embodiment of the universal test block (UTB) shown at the input and output portions of the diagram of FIG. 1.

With reference now to FIG. 2, a schematic diagram of a preferred embodiment of the UTB (test circuit 30) in accordance with the invention is shown. It has r data inputs representing a parallel bit stream of width r, and one serial data input. The r parallel data inputs are labeled $x_1, x_2, x_3, \ldots, x_r$, and the serial data input is labeled "SCAN DATA IN". In addition, it has a clock input, labeled "CLOCK," an input signal named "TEST OVER" and three control inputs labeled $c_1$, $c_2$, and $c_3$. When the UTB 30 is working as a test evaluator, the TEST OVER input indicates to it that all the test patterns in the test set have been applied, and no more test results need to be monitored. The UTB 30 has r data outputs representing a parallel bit stream, labeled $y_1$, $y_2$, $y_3$, ..., $y_r$, and one serial data output labeled "SCAN DATA OUT." The UTB 30 contains r flip-flops, labeled $FF_1$, $FF_2$, $FF_3$, ..., and $FF_r$. The outputs of the flip-flops are labeled $Q_1$, $Q_2$, $Q_3$, ..., $Q_r$, respectively. Thus, the values of $Q_1$, $Q_2$, $Q_3$, ..., $Q_r$ essentially indicate the state of the UTB 30. The UTB 30 indicates two of its special states of two outputs, namely the "ZERO DETECT" output, which carries a logic 1 when all flip-flops of the UTB 30 contain a logic 0, otherwise, it carries a logic 0. The "ONE DETECT" output carries a logic 1 when all flip-flops of the UTB 30 contain a logic 1, otherwise it carries a logic 0. In addition the UTB 30 also has an output named "TEST FAILED". This output is used by the UTB 30 when it is being employed as a test evaluator to denote whether the subsystem being monitored passed or failed the test. This output is asserted with a logic 1 if the subsystem fails the test, otherwise it carries a logic 0. The TEST FAILED output can be brought out to an external pin (not shown) to indicate a failure, or it can be used to alter, for example, the status register of the processor on the chip to halt further operations.

In the analysis of the UTB 30, a time factor is associated with the inputs, outputs and the state of the control circuit 30. Thus, a number indicating the time defined by a clock period is appended to the bit indicator. For example, $x_1(n)$, $x_2(n)$, $x_3(n)$, ..., and $x_r(n)$ indicate the parallel bit stream input during the nth clock period, $y_1(n)$, $y_2(n)$, $y_3(n)$, ..., and $y_r(n)$ indicates the parallel bit stream output during the nth clock period, and so on. The behavior of the UTB 30 can be completely defined in terms of the inputs and state during any nth clock period, and the outputs and state during the (n+1)st clock period. Table 1 set forth below presents the behavior of the UTB 30, and the modes described therein are as follows.

In the "Scan" mode, the Scan Data Out(n+1)=$Q_r(n)$. In the parallel signature analysis mode, Scan Data Out(n+1)=Feedback signal. In all other modes, Scan Data Out(n+1)=0, for all n.

The "Feedback Signal" depends on the flip-flops selected for feedback. The "Feedback Signal" is an exclusive-or combination of the outputs of the flip-flops selected.

It can be seen from Table 1 that the UTB 30 has eight modes of operations depending on the control inputs $c_1$, $c_2$, and $c_3$. These modes are discussed in detail below.

"Latch Mode": $(c_1, c_2, c_3)=(0, 0, 0)$. In this mode the UTB 30 serves as a latch. Thus the UTB 30 latches the present inputs of the parallel bit stream into the flip-flops $FF_1$–$FF_r$.

"Scan Mode": $(c_1, c_2, c_3)=(0, 0, 1)$. In this mode the UTB 30 acts as a shift register with its serial input coming from the SCAN DATA IN input, and its serial output going to the SCAN DATA OUT output. This mode facilitates the incorporation of the UTB 30 into a scan register that may be present on the VLSI chip with which the UTB 30 is associated. During this mode, new data can be shifted into the UTB 30 from the previous portion of the scan register of which the UTB 30 is a member, or from an external pin of the chip. Similarly, the present state of the UTB 30 can be shifted to the following portion of the scan register of which the UTB 30 is a member, or to an external pin so that it can be read out externally. This allows any desired data to be stored in the UTB 30, as well as enabling its contents to be read out. Thus, using the "Scan Mode", the operation of the UTB 30 itself can be tested.

"Pseudorandom Pattern Generator Mode": $(c_1, c_2, c_3)=(0, 1, 0)$. In this mode, the UTB 30 acts as a pseudorandom pattern generator, and can be used to generate test patterns if the subsystem to which these patterns are applied can be reasonably tested with pseudorandom test patterns (if the number of pseudorandom patterns needed for satisfactory testing are substantially less than all possible test patterns).

"Counter Mode": $(c_1, c_2, c_3)=(0, 1, 1)$. In this mode the UTB 30 acts as a binary up counter. It can be used to generate test patterns where exhaustive testing of the subsystem under test is feasible.

"Set Mode": $(c_1, c_2, c_3)=(1, 0, 0)$. In this mode the UTB 30 is put in the "Set" condition, i.e. with all its flip-flops $FF_1$–$FF_r$ storing a logic 1 state.

"Clear Mode": $(c_1, c_2, c_3)=(1, 0, 1)$. In this mode the UTB 30 is cleared, i.e. with all its flip-flops $FF_1$–$FF_r$ storing a logic 0 state.

"Parallel Signature Analyzer Mode": $(c_1, c_2, c_3)=(1, 1, 0)$. In this mode, the UTB 30 acts as a parallel signature analyzer, during the period in which the TEST OVER input signal carries a logic 0, i.e., during the period in which the test results are produced. When the TEST OVER signal carries a logic 1, the UTB 30 stops monitoring the test results and the state of the UTB 30 at this time is called the signature of the subsystem being tested. By applying test patterns in an appropriate sequence, it is possible to get an "all zero" signature from a fault-free subsystem under test, i.e., the state of the UTB 30 $(Q_1, Q_2, Q_3, ..., Q_r)=(0, 0, 0, ..., 0)$. This all zero signature can be easily detected by a logic 1 signal on the ZERO DETECT output. Thus, in this mode, the UTB 30 can work as a true on-chip test result evaluator.

If it is not possible to apply a test pattern sequence to produce an all zero signature from a fault-free subsystem then the signature produced after the TEST OVER input carries a logic 1 signal can be read out off the chip by converting the UTB 30 to the "Scan Mode". The signature read out can then be externally compared with the expected signature. Thus, a signature needs to be read out only if an appropriate test pattern sequence cannot be conveniently applied to produce an all zero signature from a fault-free subsystem under test. Since only the final signature accumulated needs to be evaluated, instead of individual test results, the UTB 30 performs very efficient data compression, reducing the test data volume for VLSI chips.

As pointed out above, signature analyzers perform a polynomial division on the input data stream. In both serial and parallel signature analyzers, the probability of failing to detect a multiple error in the input data stream is approximately equal to $2^{-r}$, where r is the number of flip flops in the analyzer. This probability can be further reduced by monitoring the quotient of the polynomial division process. The quotient bit can be very easily provided on the SCAN DATA output of the UTB 30. If the quotient is monitored on every cycle, the probability of failing to detect a multiple error in the input data stream of k data vectors is approximately $2^{-k}$. For a typical value of k, such as 1000, the probability is negligible ($2^{-1000}$).

"Pass Mode": $(c_1, c_2, c_3) = (1, 1, 1)$. In this mode the UTB 30 simply passes the parallel data inputs to corresponding parallel data outputs without changing its state. Thus, in this mode, the UTB 30 is simply bypassed.

TABLE 1

| Control inputs $C_1, C_2, C_3$ | | | Name of the Mode | State of the UTB 30 during the (n+1)st clock period $(Q_1(n+1), Q_2(n+1), Q_3(n+1), \ldots Q_r(n+1))$ | | | |
|---|---|---|---|---|---|---|---|
| 0 | 0 | 0 | Latch | $(x_1(n+1),$ | $x_2(n+1),$ | $x_3(n+1),$ | $\ldots, x_r(n+1))$ |
| 0 | 0 | 1 | Scan | (Scan Data $I_n(n+1)$ | $Q_1(n),$ | | $\ldots, Q_{r-1}(n))$ |
| 0 | 1 | 0 | Pseudo random | (Feed back | $Q_1(n),$ | $Q_2(n),$ | $\ldots, Q_{r-1}(n))$ |
| 0 | 1 | 1 | Counter | $(Q_1(n),$ | $Q_2(n),$ | $Q_3(n),$ | $\ldots, Q_r(n)) + 1$ |
| 1 | 0 | 0 | Set | (1, | 1, | 1, | $\ldots, 1)$ |
| 0 | 1 | 0 | Clear | (0, | 0, | 0, | $\ldots, 0)$ |
| 1 | 1 | 0 | Parallel Signal Analyzer | (Feed Back + $x_1(n+1),$ | $Q_1(n),$ + $x_2(n+1),$ | $Q_2(n),$ + $x_3(n+1),$ | $\ldots, Q_{r-1}(n))$ +, $\ldots, x_r(n+1))$ |
| 1 | 1 | 1 | Pass | $(Q_1(n),$ | $Q_2(n),$ | $Q_3(n),$ | $\ldots, Q_{r-1}(n))$ |

It should be noted that in all the modes, except the "Pass" mode, the outputs during the (n+1)st clock period are the smae as the state of the UTB 30, i.e., $y_i(n+1) = Q_i(n+1)$, for $1 <= <= r$. In the "Pass" mode, the outputs are the same as the inputs, i.e. $y_i(n+1) = x_i(n+1)$, for $1 <= i <= r$.

Figure 3A:
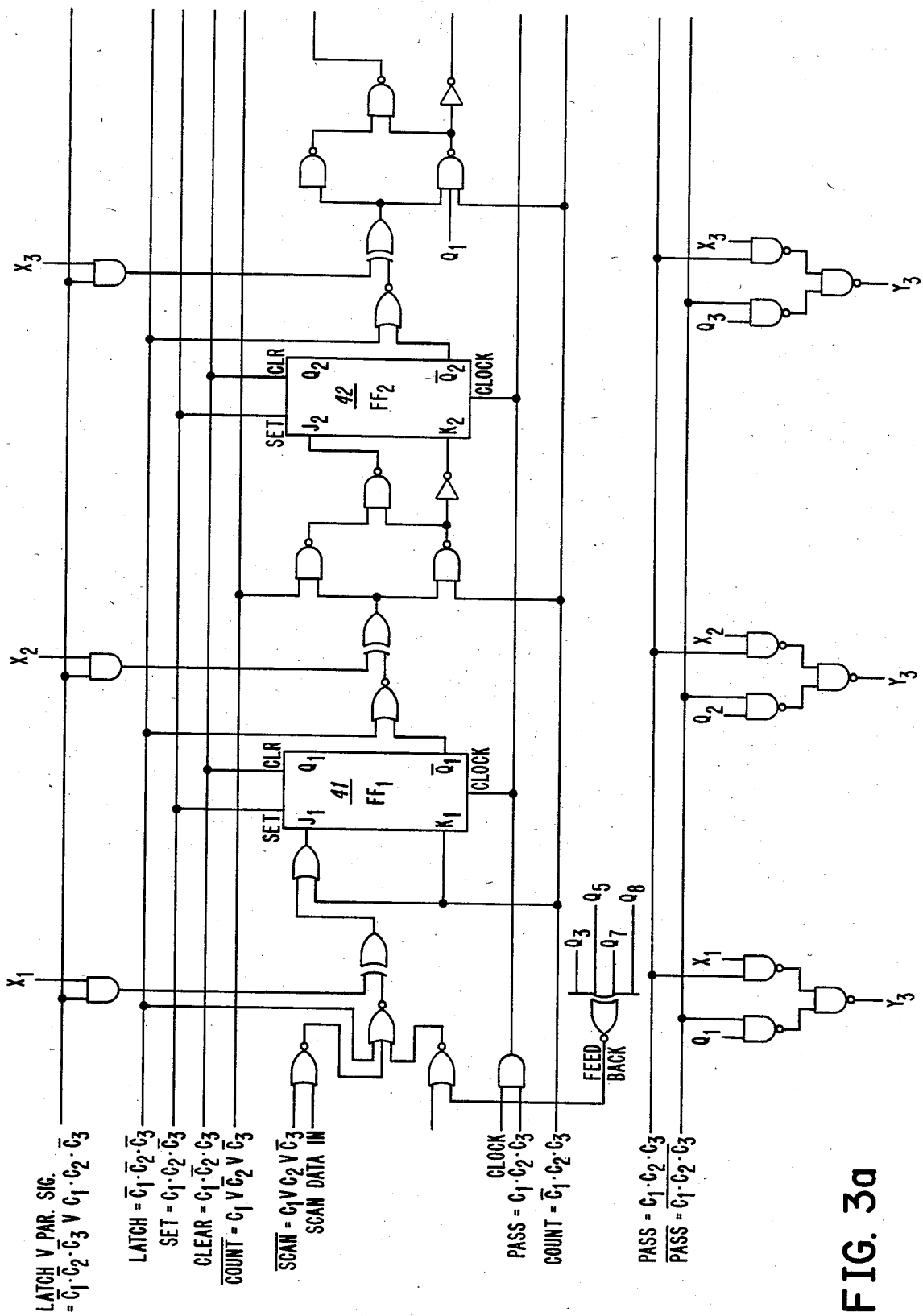
FIG. 3 comprised of FIGS. 3A and 3B, is a detailed logic diagram of the test circuit of FIG. 2, in accordance with the invention.
Figure 3B:
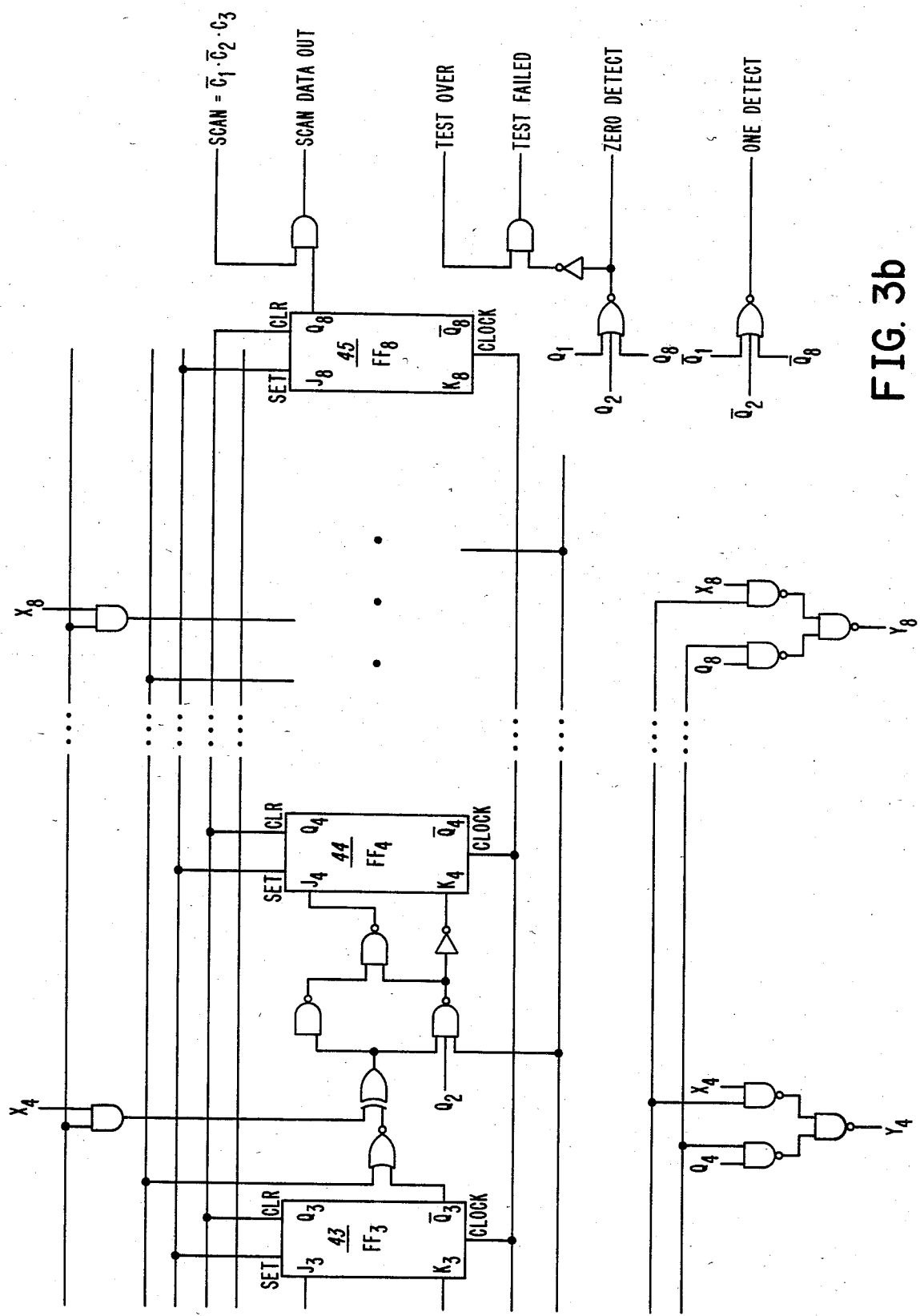

The implementation of a UTB in accordance with a preferred embodiment of the invention is shown in FIG. 3. The UTB 30 illustrated contains eight flip-flops, 41-48. (In FIG. 3, only the first four stages are shown; however, all of the stages in the circuit are substantially identical.) The various internal control signals are labeled as PASS, LATCH V PAR-SIG, LATCH, SET, CLEAR, $\overline{\text{COUNT}}$, $\overline{\text{SCAN}}$, SCAN DATA IN, CLOCK, PASS, $\overline{\text{PASS}}$, and TEST OVER, and are derived from the input control signals ($c_1, c_2, c_3$). (It will be appreciated that although the circuit shown in FIG. 3 is shown in terms of standard components such as flip-flops and logic gates, the actual realization of these components will depend on the particular technology chosen. For example, in the Metal Oxide Silicon (MOS) technology, some of the logic circuits may be implemented using pass transistors, in a fashion known in the art.

In the "Pass Mode", the CLOCK input is inhibited from reaching the flip-flops of the UTB 30 so as not to disturb their states. In the "Count Mode", each flip-flop acts as a "T-type" flip-flop, and the UTB 30 acts as a series-carry synchronous binary up-counter. Of course it is possible to implement the counter as a parallel-carry synchronous binary up counter, provided that sufficiently large fan-in and fan-out requirements are available. In all the other modes, each of the flip-flops 41-48 of the UTB 30 works as a D flip-flop.

It will be appreciated that the UTB 30 is an important building block in the design of circuits considering their testability. It can be seen that such circuits may be standard building blocks in the arsenal of the designer, or in the library of building blocks in design automation software. Furthermore, the UTB 30 can be parameterized, as follows:

Width: This parameter is the number of flip-flops in the UTB 30. Thus, the width of the UTB 30 can be chosen according to the number of inputs of the subsystem to which the UTB 30 is applying test patterns, or according to the number of outputs of the subsystem whose results are monitored by the UTB 30.

Modes: This parameter specifies the actual modes to be implemented in the UTB 30. In its full generality, all eight modes can be specified, otherwise only those modes which are most useful or relevant need be chosen. This parameterization will help in simplifying the UTB 30 logic needed.

It will be appreciated that the UTB 30 can be used as an important aid in debugging and diagnosing prototype VLSI chips, in production and manufacturing testing, and finally in field testing. In design prototype debugging, the UTB 30 can be used in the "Scan Mode" as an on-chip test probe, allowing easy access to logic deeply buried on the chip, which cannot otherwise be easily accessed from a limited number of input/output pads or probes.

During production and field testing, the UTB 30 can be used as on-chip pattern generators and test evaluators, allowing full-speed test. The test data volume is also reduced. Full speed test and reduced test data volume increase test throughput and reduce the cost of production testing. With the UTB 30, simpler and less expensive testers can be used, as most of the test responsibility is executed by the the UTB 30 itself. This is very desirable especially in field testing.

Figure 4:
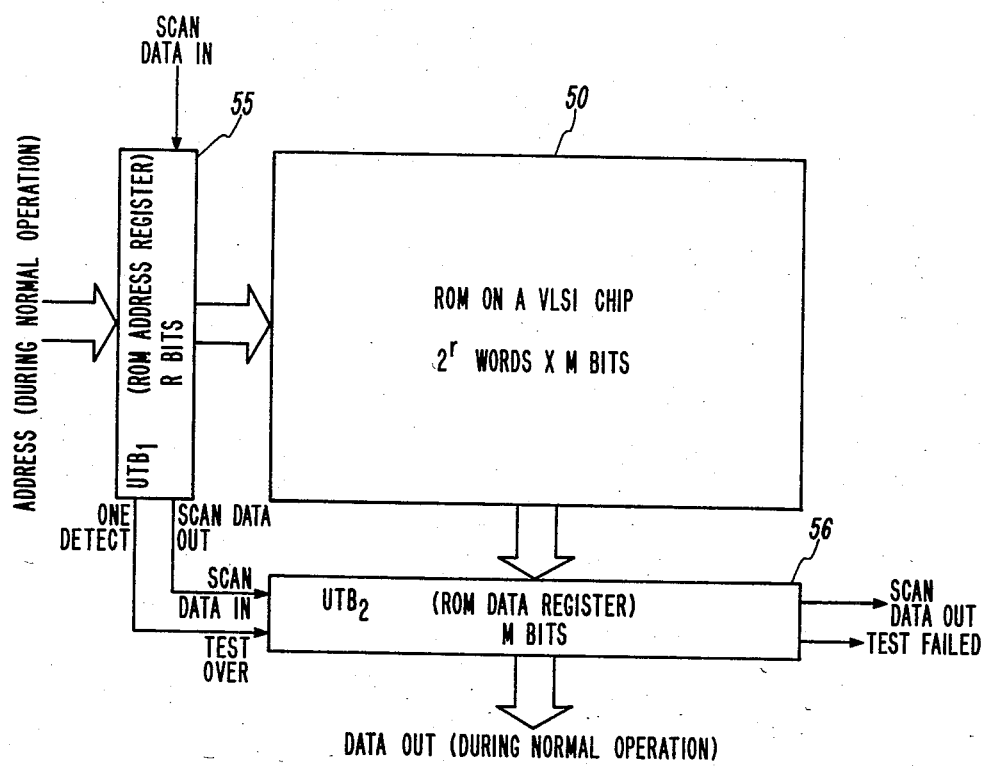
FIG. 4 is a block diagram showing a pair of test circuits of FIG. 2 used in conjunction with a $2^r$ words $\times$ m bits read-only memory (ROM) on a VLSI chip.

More specifically, the use of the UTB 30 in performing on-chip testing of a ROM or ALU is illustrated in FIG. 4. As shown, a ROM 50 is a part of a VLSI chip containing $2^r$ words of m bits each. A typical ROM 50, for instance, would require an r bit wide address register, and an m bit wide data register. With regard to such device having both address and data registers, two UTBs 55 and 56 are used, each associated with a respective one of the registers.

The UTB 55 can be designed with the following parameters:
Width: r
Modes: Latch, Scan, Counter, Set, Clear.

The UTB 56 can be designed with the following parameters:
Width: m
Modes: Latch, Scan, Set, Clear, Parallel signature analyzer.

During normal operation of the ROM 50, the UTB 55 is put in the "Latch Mode" so that it can act as the address register of the ROM 50. Similarly the UTB 56 is also put in the "Latch Mode" so that it acts as the data register. During the test of the ROM, the UTB 55 is put in the counter mode, and the UTB 56 is put in the parallel signature mode. Thus the UTB 55 essentially addresses each word of the ROM 50, starting from the word with address 00 ... 0 to the word with the address 11 ... 1. The ONE DETECT output of the UTB 55 is connected with the TEST OVER input of the UTB 56. Therefore when the UTB 55 counts through all address space and reaches address 11 ... 1, the UTB 56 stops monitoring the outputs of the ROM 50 and the state of the UTB 56 signifies the signature of the ROM 50. The TEST FAILED output of the UTB 56 is a simple AND combination of its TEST OVER input and the complement of the ZERO DETECT output. Thus, a logic 1 signal appears on the TEST FAILED output only if TEST OVER 1, AND ZERO DETECT=0.

The first $2^r-1$ words of the ROM 50 (i.e., words with addresses 00 ... 00 through 11 ... 10) contain the data determined by the application of the ROM 50. The last word of the ROM 50 (i.e., the word with the address 11 ... 11) is stored with the data which is equal to the expected state of the UTB 56 after the word with address 11 ... 10 is read during testing, i.e., the word with address 11 ... 11 stores the expected state ($Q_1(2)$, $Q_2(2)$, $Q_3(2)$, ..., $Q_m(2)$). Since the UTB 56 is in the "Parallel Signature Analyzer Mode" while the ROM 50 is tested, the expected state of the UTB 56 when the TEST OVER input carries a logic 1 signal as all zero, i.e. the fault-free ROM 50 is expected to produce an all zero signature. It should be noted that ($Q_1(2+1)$, $Q_2(2+1)$, $Q_3(2+1)$, ..., $Q_m(2+1)$)=Signature produced by the ROM 50 when the TEST OVER input carries a logic 1 signal=($Q_1(2)\oplus Q_1(2)$, $Q_2(2)\oplus Q_2(2)$, $Q_3(2)\oplus Q_3(2)$, ..., $Q_m(2)\oplus Q_m(2)$)=(0, 0, 0, ..., 0), if the ROM 50 is fault-free.) If the UTB 56 really reaches the all zero state when the test is over, it will produce a logic 0 signal on its TEST FAILED output, otherwise (i.e., the all zero state is not reached), it will produce a logic 1 signal on its TEST FAILED output. As mentioned above, the TEST FAILED output can be brought out on an external pin, or it could be connected or used to lead the processor on the chip to a halt state. This scheme of on-chip testing is guaranteed to detect all single vector errors, and the probability of failing to detect a multiple vector error is as small as $2^{-m}$. For typical values of m, such as 8 or 16, this probably is very small.

In FIG. 4, the UTB 55 and the UTB 56 are shown to be part of a scan register. The SCAN DATA OUT output of the UTB 55 is connected to the SCAN DATA IN input of the UTB 56. The UTB 55 and the UTB 56 need not be members of the same scan register, and could belong to two different scan registers. Both the UTB 55 and the UTB 56 can be put into the "Scan Mode" to test their own operation, that is by utilizing the counting and parallel signature analyzer capabilities, respectively. Important test patterns can be scanned in the UTB 55, then the UTB 55 can be put into the "Count Mode". After it perform one count-up operation, it can be put back into the "Scan Mode", and its contents read out on an external pin. A similar scheme can be used for testing the UTB 56. If the parallel inputs of the UTB 56 are held at some constant logic value(s), which happens, for instance, when the ROM 50 is in an inactive state, and the UTB 56 is put in the "Parallel Signature Mode", the UTB 56 will act as a pseudorandom pattern generator. In order to test the UTB 56, such pseudorandom patterns can be read out to an external pin by putting the UTB 56 in the "Scan Mode".

During normal operation of the ROM 50, the UTB 55 and the UTB 56 provide a particularly important function in acting as the address and data register, respectively. Therefore, the flip-flops do not form an "overhead" for the on-chip testing of the ROM 50. Only the gates required to implement "Scan", "Count", and "Parallel Signature Modes" should be viewed as the overhead. The scheme does not need any storage to store test patterns, or test results.

The UTB, in accordance with the invention, as mentioned, can be used in conjunction with other circuits on a VLSI chip. For example, in FIG. 5, the UTB is shown applied to test a 16 bit ALU 60. A UTB 61 is situated at the input of the ALU 60 and a UTB 62 is situated at the output of the ALU 60. Both the UTB 61 and the UTB 62 are 16 bits wide.

The UTB 61 is designed with the following parameters:
Width: 16 bits
Modes: Latch, Scan, Count, Set, Clear, Pass.

The UTB 62 is designed with the following parameters:
Width: 16 bits
Modes: Latch, Scan, Set, Clear, Parallel Signature Analyzer, Pass.

Figure 5:
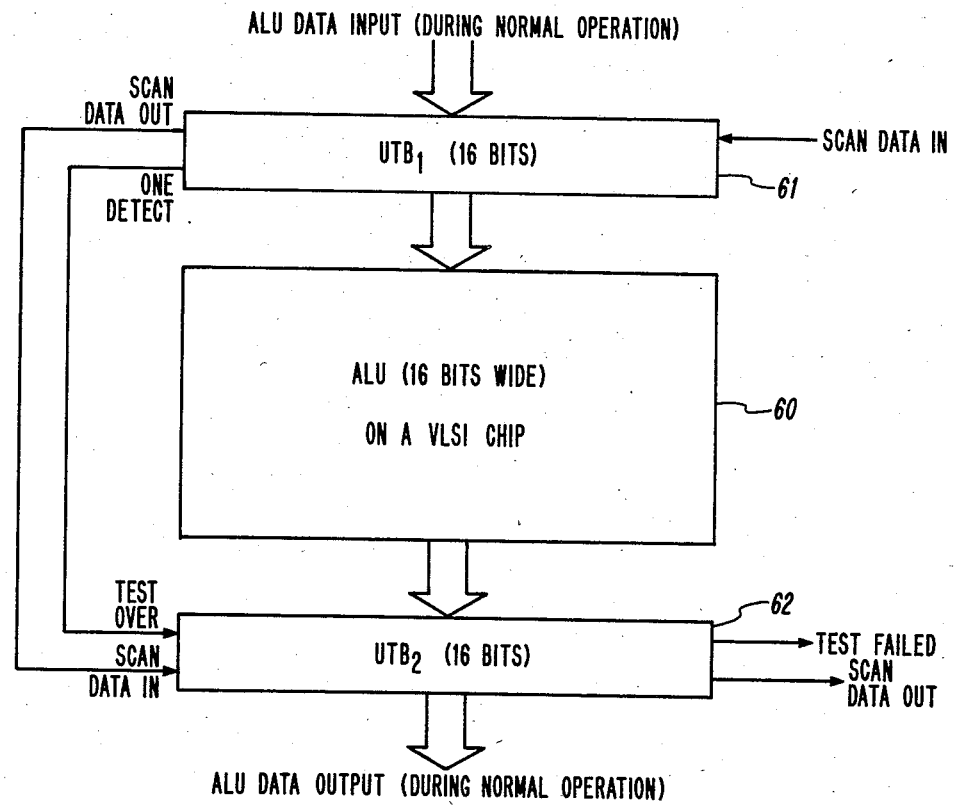
FIG. 5 is a block diagram showing a pair of test circuits of FIG. 2 in accordance with the invention used in conjunction with a 16 bit arithmetic and logic unit (ALU) on a VLSI chip.

During normal operation, the ALU 60 receives its inputs from the outputs of some previous subsystem, as shown in FIG. 5. Usually, the inputs of the ALU 60 are latched in its input latch, but this need not be the case. The inputs of the ALU 60 can be connected directly to the outputs of the previous subsystem, for instance. If the ALU 60 has latched inputs the UTB 61 operates in the "Latch Mode" during normal operation of the ALU 60. If the inputs of the ALU 60 are not latched, the UTB 61 operates in the "Pass Mode" its normal operation. The on-chip testing of the ALU 60 proceeds in the following manner.

At the beginning of testing, a certain test pattern is scanned into the UTB 61 from an external pin. This test pattern is referred to as the "Initial Test Pattern". Then the Initial Test Pattern is applied to the ALU 60 under test, and the result is monitored by the UTB 62 in the "Parallel Signature Analyzer Mode". Then, the UTB 61 is put into the "Counter Mode", and all possible test patterns from 00 ... 0 through 11 ... 1 are applied. The initial Test Pattern is selected in such a way that the expected signature to be produced by a fault free ALU would be 00 ... 0, i.e., an all zero signature. It should be noted that the ONE DETECT output of the UTB 61 is connected to the TEST OVER input of the UTB 62. Thus if the ALU 60 is in a fault-free condition, the UTB 62 should contain an all zero signature when the test is over. The TEST FAILED output of the UTB 62 is a simple AND combination of its TEST OVER input and the complement of the ZERO DETECT output. If the UTB 62 does not contain an all zero signature then the test is over, it will produce a logic 1 on its TEST FAILED output. This scheme guarantees that any single error in the output vector of the ALU 60 will be detected, and the probability of failing to detect a multiple vector error is as small as $2^{-16}$. The testing itself requires approximately 1/16 of a second with a 1 MHz clock, and the fault coverage is expected to be very good since all possible test patterns are applied at full speed operation of the ALU 60. The UTBs 61 and 62 can be themselves tested using their respective "Scan Modes", in a manner similar to that described above with reference to the UTBs 55 and 56 with respect to FIG. 3.

It will be appreciated by those skilled in the art that that this same scheme can be applied to ALUs as wide as 32 bits, as the testing time would remain under 1 second with a 1 MHz clock. For ALUs with width wider than 32 bits, the scheme can still be applied rapidly, provided that the ALU is partitioned into smaller ALUs with 32 inputs or less, and each partition is connected to a UTB at is inputs and outputs in the manner shown in FIG. 4.

Thus, it can be seen that the UTBs in accordance with the invention as above described are very efficient on-chip test pattern generators, as well as evaluators, because the patterns are generated by counting or by pseudorandom pattern generation, and the evaluation of test results is accomplished by parallel signature analysis. The flip-flops used in the UTBs are usually required anyway for input and output latches of the subsystem with which the UTB is associated, and therefore, they do not add to any required circuitry overhead. The circuits require essentially no additional storage requirements, and the circuits themselves add very little complexity to the overall testing requirements, since they can self-test by applying test patterns to a UTB, and the test results read out by simply putting the UTB into the "Scan Mode". No additional logic is needed to apply test patterns and monitor test results.

In addition to these advantages, the UTBs are capable of applying test patterns to the subsystem under test at full speed, and since usually all possible test patterns are applied (after partitioning the subsystem, if it has a large number in inputs) the fault coverage is expected to be very good. No external test generation and fault simulation is needed, therefore time consuming, difficult and expensive processing is eliminated. Since testing is performed on the chip itself, an expensive external tester is not required.

Although the invention has been described and illustrated with a certain degree of particularity, it will be understood that the present disclosure has been made by way of example only, and that numerous changes in the combination and arrangement of parts may be resorted to without departing from the spirit and the scope of the invention as hereinafter claimed.

I claim:

1. A test circuit for on-chip testing of a VLSI subsystem, comprising:
    a test generator on said VLSI chip for applying a predetermined test pattern to an input channel of said subsystem, wherein said test generator is configurable to function as a latch, a psuedorandom pattern generator for generating pseudorandom test patterns, and a counter to generate a test pattern in accordance with a binary up count, and wherein said test generator is configured to function as one of the configurable functions in accordance with the state of a mode controlling control input to said test generator; and
    a test evaluator on said VLSI chip for receiving output signals from said subsystem, wherein said test evaluator is configurable to function as a latch and a parallel signature analyzer, wherein said test evaluator is configured to function as one of the configurable functions in accordance with the state of a second mode controlling control input to said test evaluator.

2. The test circuit of claim 1, wherein said test generator is further configurable to function in a scan mode, to be set, to be cleared and to function in a pass mode.

3. The test circuit of claim 2, wherein said test evaluator is further configurable to function in a scan mode, to be set, to be cleared and to function in a pass mode.

4. A system for testing of a VLSI subsystem, the VLSI subsystem including a plurality of test circuits formed on a VLSI chip, the test circuits each comprising:
    state registers for storing digital data input to the test circuit;
    a serial input to said shift registers for serially inputting, when selected, a predetermined pattern to said state registers;
    a serial output from said state registers for serially outputting, when selected, a serial data stream reflecting data stored in said state registers;
    a parallel input to said state registers for inputting, when selected, parallel data to be stored in said state registers;
    a parallel output from said state registers for outputting, when selected, parallel data reflecting data stored in said state registers;
    feedback circuitry coupled from selected state registers to other selected state registers for generating, when selected, pseudo-random test patterns;
    counter feedback circuitry for causing, when selected, said state registers to function as a counter;
    logic circuitry coupled to said state registers for generating at least one output signal which indicates that said state registers have entered a preselected state; and
    control circuitry having control inputs coupled to said state registers and to said feedback and counter feedback circuitry for causing the test circuit to operate in one selected mode in accordance with a predetermined signal pattern coupled to the control inputs.

5. The system of claim 4, wherein the selected mode allows the test circuits to operate in one of the modes "Latch", "Scan", "Counter", "Set", "Clear", "Pass", "Pseudorandom Pattern Generator" and "Parallel Signature Analyzer".

6. A method for on-chip testing of a VLSI subsystem, comprising the steps of:
    (a) providing a test generator and a test evaluator coupled to the input and the output of the subsystem to be tested, respectively, wherein the test generator and the test evaluator can both be operated in one selected mode out of a plurality of selectable modes, and wherein the mode in which each is operated at any pont in time is controlled by mode control signals applied to the test generator and to the test evaluator;
    (b) applying control signals to the test generator to select an operating mode therefor;
    (c) applying control signals to the test evaluator to select on operating mode therefor;
    (d) applying a predtermined test pattern to the test generator;
    (e) operating the subsystem for a predetermined time;
    (f) generating an output signal from the test evaluator which is indicative of the results of the subsystem operation.

7. The method of claim 6, wherein the test generator and the test evaluator are of substantially identical construction.

8. The method of claim 7, wherein the plurality of selectable modes in which the test generator and the test evaluator can be controlled to operate include "Latch", "Scan", "Counter", "Set", "Clear", "Pass", "Pseudorandom pattern Generator" and "Parallel Signature Analyzer" modes.

* * * * *